(12) United States Patent
Liu et al.

(10) Patent No.: US 8,890,128 B2
(45) Date of Patent: Nov. 18, 2014

(54) ORGANIC DISPLAY DEVICE

(71) Applicants: Yawei Liu, Guangdong (CN); Yuan-Chun Wu, Guangdong (CN)

(72) Inventors: Yawei Liu, Guangdong (CN); Yuan-Chun Wu, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 85 days.

(21) Appl. No.: 13/703,074

(22) PCT Filed: Sep. 26, 2012

(86) PCT No.: PCT/CN2012/081976
§ 371 (c)(1),
(2), (4) Date: Dec. 10, 2012

(87) PCT Pub. No.: WO2014/032349
PCT Pub. Date: Mar. 6, 2014

(65) Prior Publication Data
US 2014/0077167 A1 Mar. 20, 2014

(30) Foreign Application Priority Data
Sep. 3, 2012 (CN) .......................... 2012 1 0321306

(51) Int. Cl.
*H01L 51/05* (2006.01)
*H01L 51/30* (2006.01)
*H01L 27/28* (2006.01)

(52) U.S. Cl.
CPC .................................... *H01L 27/288* (2013.01)
USPC ............. 257/40; 257/431; 257/436; 257/448; 257/464; 438/57; 438/59; 438/74; 438/82

(58) Field of Classification Search
USPC .............. 315/149; 257/84, E27.119, 40, 431, 257/436, 448, 464; 438/57, 59, 74, 82
See application file for complete search history.

(56) References Cited

U.S. PATENT DOCUMENTS

2004/0239243 A1* 12/2004 Roberts et al. ................ 313/512
2006/0207192 A1* 9/2006 Durham ............................ 52/73
2012/0139424 A1* 6/2012 Pasveer et al. ................ 315/149

* cited by examiner

*Primary Examiner* — Zandra Smith
*Assistant Examiner* — Tsz Chiu
(74) *Attorney, Agent, or Firm* — Kirton McConkie; Evan R. Witt

(57) ABSTRACT

The present invention provides an organic display device, comprising: an organic solar module for obtaining solar energy and converting the obtained solar energy into electric power, and an ultraviolet organic light emitting module driven to emit ultraviolet light by the electric power obtained from the organic solar module. The present invention can fully use solar energy and carry out ultraviolet display by combining the ultraviolet organic light emitting module with the organic solar module.

14 Claims, 4 Drawing Sheets

ORGANIC DISPLAY DEVICE

FIELD OF THE INVENTION

The present invention relates to an organic display device.

BACKGROUND OF THE INVENTION

Organic Light Emitting Diode (OLED), also known as Organic Electroluminescence Display (OELD), is a new generation of lighting display device which has organic luminescent materials sandwiched between a transparent anode and a metal reflective cathode for emitting light by applying a voltage to the organic luminescent materials. The OLED does not require a back light device, so it can be made thinner and consume power less than other types of flat panel display. Meanwhile, the OLED has wide working temperature ranges and low manufacturing cost, and therefore the application of OLED is becoming wider. Furthermore, organic luminescent materials of different colors can be used to display various light of different colors.

With the continuous development of organic light-emitting diode, there is ultraviolet-organic light emitting diode (UV-OLED) for being used as an ultraviolet light source, Advantages of the UV-OLED are eco-friendly, low-cost, easily large area production, easy integration with flexible substrate, etc.

With the growing popularity of solar energy, it is increasing for the efficiency of solar energy utilization, for example, advantages of the organic solar equipment are material flexibility, simple manufacture, wide range of material sources and low-cost to be thus used widely in the power generation, lighting and other fields.

Therefore, it is one of the direction of the organic light emitting diode research field to think how to combine the ultraviolet organic light emitting diode with the solar energy to be able to fully utilize the solar energy and be able to achieve ultraviolet display.

SUMMARY OF THE INVENTION

A primary object of the present invention is to provide a structure of an organic light emitting diode device, which combines an ultraviolet organic light emitting diode with the solar energy to be able to fully utilize the solar energy and be able to achieve ultraviolet display.

To achieve the above object, the present invention provides an organic display device which comprises:
- at least one display area;
- at least one non-display area alternately arranged with the display area;
- at least one organic solar module formed in the non-display area to obtain solar energy and convert the obtained solar energy into electric power;
- an energy storage module connected with the organic solar module to store the electric power obtained by the organic solar module; and
- at least one ultraviolet organic light emitting module formed in the display area and connected with the energy storage module to be driven to emit ultraviolet light by the electric power obtained from the energy storage module.

In one embodiment of the present invention, the organic display device comprises a first substrate, the ultraviolet organic light emitting module comprises a first anode and a first cathode, and the organic solar module comprises a second anode and a second cathode.

In one embodiment of the present invention, the first anode and the second anode are formed from an identical anode layer on the first substrate, and the first cathode and the second cathode are formed from an identical cathode layer on the first substrate.

In one embodiment of the present invention, the first anode is separated from the second anode, and the first cathode is separated from the second cathode.

In one embodiment of the present invention, the first anode is connected with the second anode, and the first cathode is separated from the second cathode.

In one embodiment of the present invention, an anode connection line and a cathode connection line are formed on the first substrate, the first cathode and the second cathode are connected with an external lead through the cathode connection line, and the first anode and the second anode are connected with another external lead through the anode connection line.

In one embodiment of the present invention, the organic display device further comprises a second substrate disposed opposite the first substrate, the organic solar module is disposed on the first substrate, and the ultraviolet organic light emitting module is disposed on the second substrate.

In one embodiment of the present invention, the energy storage module further comprises an external power supply terminal connected with an external power supply to obtain and store the electric power from the external power supply.

A secondary object of the present invention is to provide a structure of an organic light emitting diode device, which combines ultraviolet organic light emitting diode with the solar energy to be able to fully utilize the solar energy and be able to achieve ultraviolet display.

To achieve the above object, the present invention provides an organic display device which comprises:
- at least one organic solar module obtaining solar energy and converting the solar energy into electric power; and
- at least one ultraviolet organic light emitting module driven to emit ultraviolet light by the electric power obtained from the energy storage module.

In one embodiment of the present invention, the organic display device comprises at least one display area and at least one non-display area, the organic solar module is formed in the non-display area, the ultraviolet organic light emitting module is formed in the display area, and the display area is alternately arranged with the non-display area.

In one embodiment of the present invention, the organic display device comprises a first substrate, the ultraviolet organic light emitting module comprises a first anode and a first cathode, and the organic solar module comprises a second anode and a second cathode.

In one embodiment of the present invention, the first anode and the second anode are formed from an identical anode layer on the first substrate, and the first cathode and the second cathode are formed from an identical cathode layer on the first substrate.

In one embodiment of the present invention, the first anode is separated from the second anode, and the first cathode is separated from the second cathode.

In one embodiment of the present invention, the first anode is connected with the second anode, and the first cathode is separated from the second cathode.

In one embodiment of the present invention, an anode connection line and a cathode connection line are formed on the first substrate, the first cathode and the second cathode are connected with an external lead through the cathode connection line, and the first anode and the second anode are connected with another external lead through the anode connection line.

In one embodiment of the present invention, the organic display device further comprises a second substrate disposed opposite the first substrate, the organic solar module is disposed on the first substrate, and the ultraviolet organic light emitting module is disposed on the second substrate.

In one embodiment of the present invention, the organic display device further comprises:

an energy storage module connected with the organic solar module and the ultraviolet organic light emitting module to store the electric power obtained by the organic solar module, wherein the ultraviolet organic light emitting module obtains the electric power from the energy storage module.

In one embodiment of the present invention, the energy storage module further comprises an external power supply terminal connected with an external power supply to obtain and store the electric power from the external power supply.

Compared to the prior art, the present invention is to form a solar energy device and an ultraviolet light-emitting device in one organic display device, wherein the electric power generated by the solar energy device is directly used as the power for the ultraviolet light-emitting device to emit ultraviolet light, so that it can be able to fully utilize the solar energy and be able to achieve ultraviolet display.

The above-mentioned content of the present invention can be best understood by referring to the following detailed description of the preferred embodiments and the accompanying drawings.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto. In figures, similar structural units are labeled by the same numerals.

Figure 1:
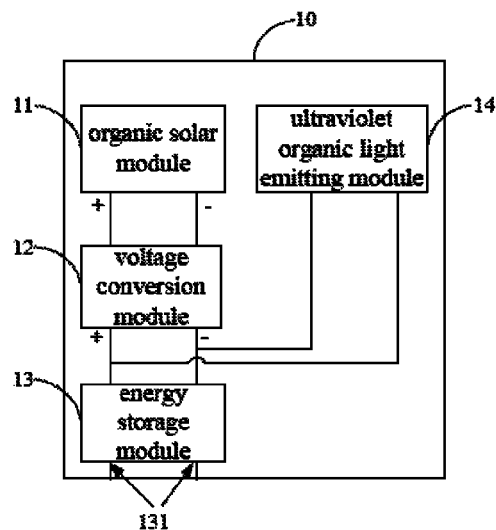
FIG. 1 is a structural schematic view of an organic display device according to a first embodiment of the present invention.

Referring to FIG. 1, FIG. 1 is a structural schematic view of an organic display device according to a first embodiment of the present invention. The organic display device 10 comprises an organic solar module 11, a voltage conversion module 12, an energy storage module 13 and an ultraviolet organic light emitting module 14, wherein the energy storage module 13 further comprises an external power supply terminal 131.

The organic solar module 11 is connected to the voltage conversion module 12, the voltage conversion module 12 is connected to the energy storage module 13, the energy storage module 13 is connected to the ultraviolet organic light emitting module 14, wherein the organic solar module 11 is used to obtain the solar energy, for example, absorbing sunlight as solar energy, and converting the obtained solar energy into electric power. the voltage conversion module 12 converts a voltage of the electric power generated by the solar module 11 into a suitable voltage, the suitable voltage is matched with a voltage carried by the energy storage module 13, and the energy storage module 13 stores the electrical energy converted by the voltage conversion module 12. The ultraviolet organic light emitting module 14 is driven to emit ultraviolet light by the electric power obtained from the energy storage module 13.

In one embodiment, when the sunlight obtained from the organic solar module 11 is insufficient or the electric power stored from the energy storage module 13 is low, the energy storage module 13 can obtain and store the electric power from the external power supplied by the external power supply terminal 131 (not shown).

Figure 2:
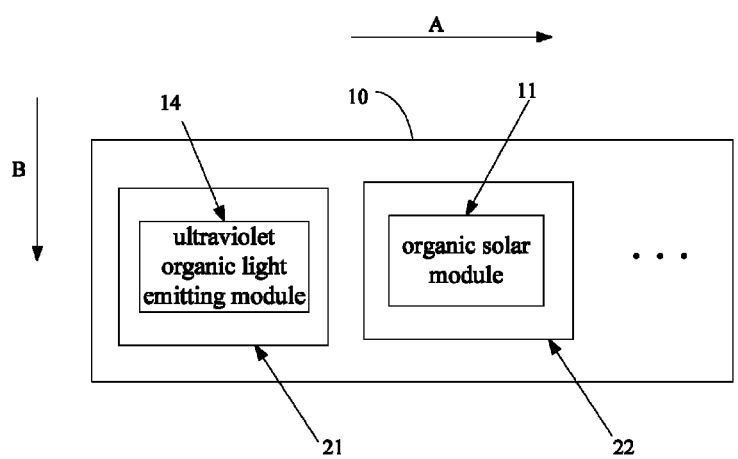
FIG. 2 is a structural top view of the organic display device according to the first embodiment of the present invention.

Referring to FIG. 2, FIG. 2 is a structural top view of the organic display device according to the first embodiment of the present invention. The organic display device 10 comprises at least one display area 21 and at least one non-display area 22, wherein the organic solar module 11 is formed in the non-display are 22, and the ultraviolet organic light emitting module 14 is formed in the display area 21. At least one non-display area is alternately arranged with at least one display area along a parallel line A or a longitudinal line B. In the present invention, the display area 21 and the non-display area 22 are designed to arrange in the same column (or row), so that it can ensure that the organic solar module 11 of the organic display device 10 can fully absorb the sunlight as solar energy and the ultraviolet organic light emitting module 14 of the display area 21 can display ultraviolet light.

Figure 3:
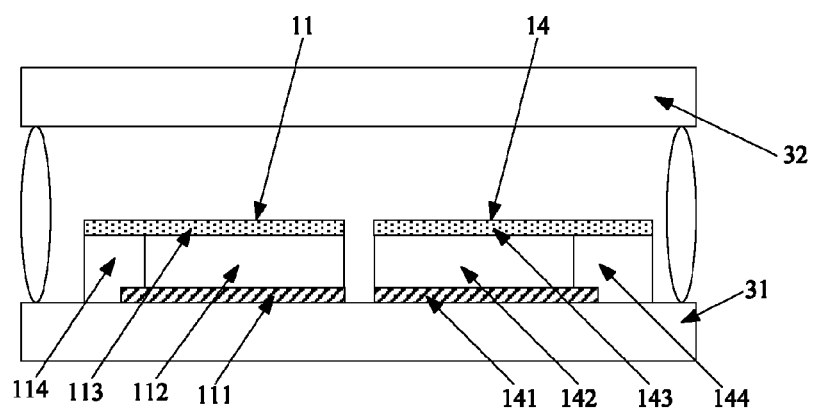
FIG. 3 is a cross-sectional view of the organic display device according to the first embodiment of the present invention.

Referring to FIG. 3, FIG. 3 is a cross-sectional view of an organic display device according to the first embodiment of the present invention. The organic display device 10 comprises a first substrate 31 and a second substrate 32 disposed opposite to the first substrate. The organic solar module 11 and the ultraviolet organic light emitting module 14 are disposed between the first substrate 31 and the second substrate 32. The ultraviolet organic light emitting module 14 comprises a first anode 141, an organic light-emitting layer 142, a first cathode 143, and a first insulating layer 144 formed between the first anode 141 and the first cathode 143, wherein the organic solar module 11 comprises a second anode 111, a photoelectric conversion layer 112, a second cathode 113, and a second insulating layer 114 formed between the second anode 111 and the second cathode 113, In the embodiment as shown in FIG. 3, the organic solar module 11 and the ultraviolet organic light emitting module 14 are both formed on the first substrate 31, the first anode 141 and the second anode 111 are formed from an identical anode layer on the first substrate 31, and the first cathode 143 and the second cathode 113 are formed from an identical cathode layer on the first substrate 31. The first insulating layer 144 is filled in a position other than the organic light-emitting layer 142, and the second insulating layer 114 is filled in a position other than the photoelectric conversion layer 112. The first anode 141 is separated from the second anode 111, and the first cathode 143 is separated from the second cathode 113.

Furthermore, the photoelectric conversion layer 112 of the organic solar module 11 uses polymer hetero-junction P-N structure, which is a mixture of P-type material and N-type material, such as organic mixture including P3HT: PCBM mixture, MEH-PPV: PCBM mixture, or MDMO-PPV: PCBM mixture. When forming the photoelectric conversion layer 112, the organic mixture is firstly dissolved in an organic solvent, such as chlorobenzene, and then sprayed onto a specific position of the first substrate 31 by a printing technology. P3HT is poly(3-hexythiophene), MEH-PPV is poly(2-methoxy-, 5-(2'-ethyl-hexyloxy)-p-phenylenevinylene), MDMO-PPV is poly(3-hexyl thiophene) (i.e. P3HT) and poly(p-phenylene vinylene) derivatives, and PCBM is fullerene derivative.

Figure 4:
FIG. 4 is a structural cross-sectional view of an ultraviolet organic light emitting module according to the first embodiment of the present invention.

Referring to FIG. 4, FIG. 4 is a detail structural cross-sectional view of an ultraviolet organic light emitting module 14 according to the present invention. The organic light-emitting layer 142 comprises a hole transporting layer 151, an ultraviolet organic light emitting layer 152 and an electron transporting layer 153.

In a bias voltage condition, the electrons from the first cathode 143 and the holes from the first anode 141 are recombined in the ultraviolet organic light emitting layer 152, so that the ultraviolet organic light emitting layer 152 emits ultraviolet light through the hole transporting layer 151, the first anode 141 and the first substrate 31 in turn. The ultraviolet organic light emitting module 14 is a planar light, so the organic display device can be a large area display device of ultraviolet light.

Figure 5:
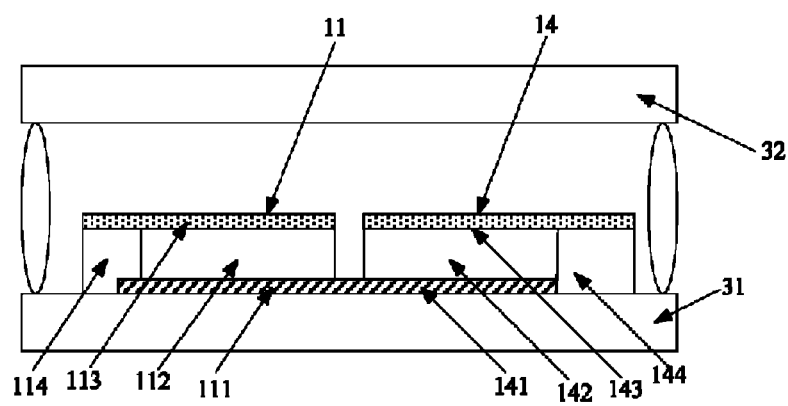
FIG. 5 is a cross-sectional view of an organic display device according to a second embodiment of the present invention.

Referring to FIG. 5, FIG. 5 is a cross-sectional view of an organic display device according to a second embodiment of the present invention. As shown, the difference between the second embodiment and the first embodiment of FIG. 3 is that, in the second embodiment of FIG. 5, the first anode 141 is connected with the second anode 111, and the first cathode 143 is separated from the second cathode 113. The detailed description of other structures of the organic display apparatus in FIG. 5 can be referred to the description of FIG. 3, and thus is omitted herein.

Figure 6:
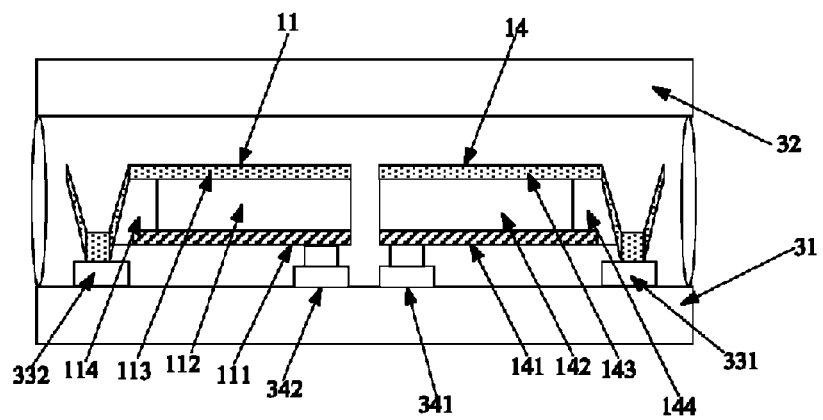
FIG. 6 is a cross-sectional view of an organic display device according to a third embodiment of the present invention.

Referring to FIG. 6, FIG. 6 is a cross-sectional view of an organic display device according to a third embodiment of the present invention. In the third embodiment, the first anode 141 is separated from the second anode 111, and the first cathode 143 is separated from the second cathode 113. An anode connection line is formed on the first substrate 31, such as a first anode connection line 341 and a second anode connection line 342, while a cathode connection line are formed on the first substrate 31, such as a first cathode connection line 331 and a second cathode connection line 332, wherein the first cathode 143 is connected the first cathode connection line 331 and connected with an external lead through the first cathode connection line 331, the first anode 141 is connected the first anode connection line 341 and connected with the external lead through the first anode connection line 341, the second cathode 113 is connected the second cathode connection line 332 and connected with the external lead through the second cathode connection line 332, the second anode 111 is connected the second anode connection line 342 and connected with the external lead through the second anode connection line 342. The present invention can reduce the impedance of each electrode by providing the connection lines.

Figure 7:
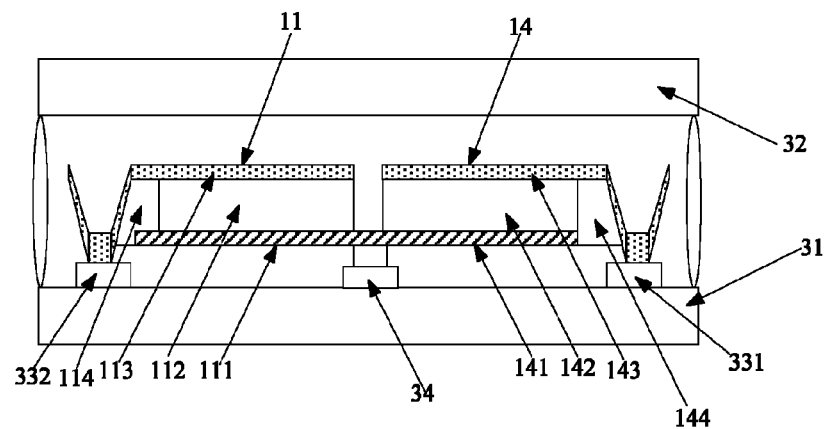
FIG. 7 is a cross-sectional view of an organic display device according to a fourth embodiment of the present invention.

Referring to FIG. 7, FIG. 7 is a cross-sectional view of an organic display device according to a fourth embodiment of the present invention. As shown, the same portion as the third embodiment of FIG. 6 is that a cathode connection line is formed, such as a first cathode connection line 331 and a second cathode connection line 332, wherein the first cathode 143 is connected with the first cathode connection line 331 and connected with the external lead through the first cathode connection line 331, the second anode 111 is connected with the second cathode connection line 332 and connected with the external lead through the second cathode connection line 332. In the fourth embodiment, the difference thereof is that the first anode 141 is connected with the second anode 111, the first cathode 143 is separated from the second cathode 113, an anode connection line 34 is provided, each of the first anode 141 and the second anode 111 is connected with the anode connection line 34 and connected with the external lead through the anode connection line 34.

Figure 8:
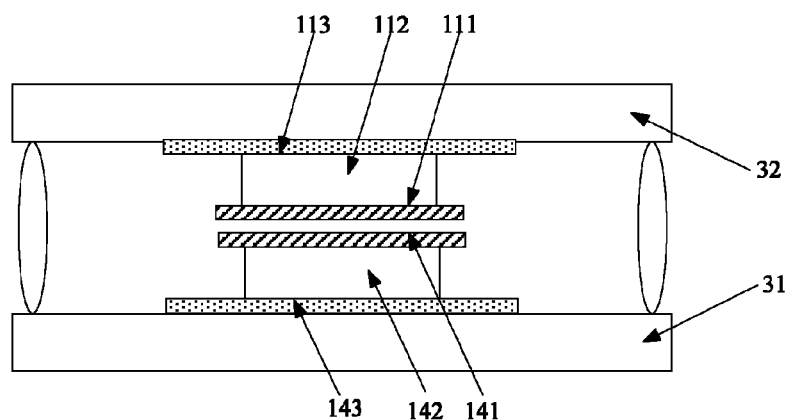
FIG. 8 is a cross-sectional view of an organic display device according to a fifth embodiment of the present invention.

Referring to FIG. 8, FIG. 8 is a cross-sectional view of an organic display device according to a fifth embodiment of the present invention. In the fifth embodiment, the ultraviolet organic light emitting module 14 is disposed on the first substrate 31, the organic solar module 11 is disposed on the second substrate 32, the ultraviolet organic light emitting module 14 is disposed opposite to the organic solar module 11 to save space. In the fifth embodiment, the first anode 141 and the second anode 111 are not formed from the same anode layer, but manufactured separately, while the first cathode 143 and the second cathode 113 are not formed from the same cathode layer, but manufactured separately. The detailed structures of the fifth embodiment in FIG. 8 can be referred to the detailed description of FIG. 3, and thus is omitted herein.

The present invention is to form an organic solar device and an ultraviolet organic light emitting device on the same organic display device, wherein the electric power generated by the solar energy device is directly used as the power for the ultraviolet light-emitting device to emit ultraviolet light, so that it can be able to fully utilize the solar energy and be able to achieve ultraviolet display.

The present invention has been described with a preferred embodiment thereof and it is understood that many changes and modifications to the described embodiment can be carried out without departing from the scope and the spirit of the invention that is intended to be limited only by the appended claims.

What is claimed is:

1. An organic display device, comprising:
   at least one display area;
   at least one non-display area alternately arranged with the display area;
   at least one organic solar module formed in the non-display area to obtain solar energy and convert the obtained solar energy into electric power;
   an energy storage module connected with the organic solar module to store the electric power obtained by the organic solar module; and
   at least one ultraviolet organic light emitting module formed in the display area and connected with the energy storage module to be driven to emit ultraviolet light by the electric power obtained from the energy storage module, wherein the organic display device comprises a first substrate, the ultraviolet organic light emitting module comprises a first anode and a first cathode, and the organic solar module comprises a second anode and a second cathode, and the first anode and the second anode are formed from an identical anode layer on the first substrate, and the first cathode and the second cathode are formed from an identical cathode layer on the first substrate.

2. The organic display device according to claim 1, wherein the first anode is separated from the second anode, and the first cathode is separated from the second cathode.

3. The organic display device according to claim 1, wherein the first anode is connected with the second anode, and the first cathode is separated from the second cathode.

4. The organic display device according to claim 1, wherein an anode connection line and a cathode connection line are formed on the first substrate, the first cathode and the second cathode are connected with an external lead through the cathode connection line, and the first anode and the second anode are connected with the external lead through the anode connection line.

5. The organic display device according to claim 1, wherein the organic display device further comprises a second substrate disposed opposite to the first substrate, the organic solar module is disposed on the first substrate, and the ultraviolet organic light emitting module is disposed on the second substrate.

6. The organic display device according to claim 1, wherein the energy storage module further comprises an external power supply terminal connected with an external power supply to obtain and store the electric power from the external power supply.

7. An organic display device, comprising:
at least one organic solar module obtaining solar energy and converting the solar energy into electric power; and
at least one ultraviolet organic light emitting module driven to emit ultraviolet light by the electric power obtained from the energy storage module, wherein the organic display device comprises a first substrate, the ultraviolet organic light emitting module comprises a first anode and a first cathode, and the organic solar module comprises a second anode and a second cathode, and the first anode and the second anode are formed from an identical anode layer on the first substrate, and the first cathode and the second cathode are formed from an identical cathode layer on the first substrate.

8. The organic display device according to claim 7, wherein the organic display device comprises at least one display area and at least one non-display area, the organic solar module is formed in the non-display area, the ultraviolet organic light emitting module is formed in the display area, and the display area is alternately arranged with the non-display area.

9. The organic display device according to claim 7, wherein the first anode is separated from the second anode, and the first cathode is separated from the second cathode.

10. The organic display device according to claim 7, wherein the first anode is connected with the second anode, and the first cathode is separated from the second cathode.

11. The organic display device according to claim 7, wherein an anode connection line and a cathode connection line are formed on the first substrate, the first cathode and the second cathode are connected with an external lead through the cathode connection line, and the first anode and the second anode are connected with another external lead through the anode connection line.

12. The organic display device according to claim 7, wherein the organic display device further comprises a second substrate disposed opposite to the first substrate, the organic solar module is disposed on the first substrate, and the ultraviolet organic light emitting module is disposed on the second substrate.

13. The organic display device according to claim 7, wherein the organic display device further comprises:
an energy storage module connected with the organic solar module and the ultraviolet organic light emitting module to store the electric power obtained by the organic solar module, wherein the ultraviolet organic light emitting module obtains the electric power from the energy storage module.

14. The organic display device according to claim 13, wherein the energy storage module further comprises an external power supply terminal connected with an external power supply to obtain and store the electric power from the external power supply.

* * * * *